United States Patent [19]
Habuka et al.

[11] Patent Number: 6,008,128
[45] Date of Patent: Dec. 28, 1999

[54] METHOD FOR SMOOTHING SURFACE OF SILICON SINGLE CRYSTAL SUBSTRATE

[75] Inventors: Hitoshi Habuka; Toru Otsuka, both of Annaka; Masatake Katayama, Tokyo, all of Japan

[73] Assignee: Shin-Etsu Handotai Co., Ltd., Tokyo, Japan

[21] Appl. No.: 09/105,155

[22] Filed: Jun. 26, 1998

[30] Foreign Application Priority Data

Jul. 18, 1997 [JP] Japan ................... 9-209714

[51] Int. Cl.⁶ .................. H01L 21/306
[52] U.S. Cl. .............. 438/695; 438/706; 438/734
[58] Field of Search .................. 438/695, 706, 438/734

[56] References Cited

U.S. PATENT DOCUMENTS

| | | | |
|---|---|---|---|
| 5,846,321 | 12/1998 | Habuka et al. | 117/102 |
| 5,869,387 | 2/1999 | Sato et al. | 438/459 |
| 5,885,346 | 3/1999 | Habuka et al. | 117/104 |

FOREIGN PATENT DOCUMENTS

| | | | |
|---|---|---|---|
| 0 746 011 A2 | 4/1996 | European Pat. Off. | H01L 21/205 |
| 0 848 088 A1 | 6/1998 | European Pat. Off. | C30B 33/00 |
| 0 867 925 A2 | 9/1998 | European Pat. Off. | H01L 21/312 |

OTHER PUBLICATIONS

Journal of Electrochemical Society Habuka, Hitoshi Roughness of Silicon Surface Heated Hydrogen Ambient vol. 142, No. 9 pp. 3092–3098.

*Primary Examiner*—Felisa Hiteshew
*Assistant Examiner*—Donald F. Champagne
*Attorney, Agent, or Firm*—Snider & Associates; Ronald R. Snider

[57] ABSTRACT

A method for microscopically smoothing a surface of a wafer made of silicon single crystal having a low resistivity. In the method, a native oxide film grown on a surface of a wafer having polished by an ordinary mirror polishing process is removed at a temperature of less than 100° C. with use of a mixture gas of HF and $H_2$, and then an organic substance deposited thereon is removed at a temperature of less than 800° C. with use of a mixture gas of HCl and $H_2$. Re-growth of an oxide film is suppressed in a consistent $H_2$ atmosphere, during which the wafer is substantially not varied in its surface roughness. Then the wafer is thermally treated in an $H_2$ gas atmosphere at a temperature of not less than 800° C. and less than 1000° C. A process of etching the silicon single crystal substrate and a process of depositing silicon atoms caused by decomposition of a silane compound generated are competitively carried out to thereby soften the microscopic rough surface of the wafer and to improve a smoothness over the smoothness of the mirror-polished surface. Since all process temperatures are set to be less than 1000° C., vaporization of impurities in the wafer can be suppressed and its low resistivity can be secured.

3 Claims, 3 Drawing Sheets

VARIATION IN WAFER SURFACE ROUGHNESS
CAUSED BY PROCESSING

METHOD FOR SMOOTHING SURFACE OF SILICON SINGLE CRYSTAL SUBSTRATE

This disclosure relates to subject matter contained in Japanese patent application No.209714/1997 (filed on Jul. 18, 1997).

BACKGROUND OF THE INVENTION

1. Field of the Invention

This invention relates to a method for smoothing a rough surface of a silicon single crystal substrate to obtain a highly flat and smooth surface.

2. Description of the Related Art

A silicon single crystal substrate has a mirror surface polished, in general, by a chemical-mechanical polishing (CMP) method. This is one of the conditions required when it is desired to form a very fine structure on the surface of the silicon single crystal substrate in a step of fabricating an electronic device and so on, in order to obtain a high manufacturing yield.

For example, the design rules of electronic device are almost in the stage of requiring 0.3 to 0.2 $\mu$m of deep submicron order of accuracy as a practical level. For fabrication of such an electronic device, some of thin films formed on a silicon single crystal substrate are required to have a thickness as thin as several nm for a gate insulating film, etc. That is, a microscopic smoothness of the surface of the substrate has great influences even on the quality of the thin film.

In order to prevent adverse influences of micro-defects in the substrate to device characteristics, there has been in these years employed a so-called epitaxial wafer in which a silicon single crystal thin film is epitaxially grown on a silicon single crystal substrate. Sufficient removal of foreign matter such as a native oxide film or particles from the substrate prior to the epitaxial growth is essential from the viewpoint of avoiding defects in a grown layer. In addition to it, the smoothness of the substrate surface is one of highly important factors. A mean squared surface roughness Rms of a mirror surface attained by the above-mentioned CMP is about 0.1 nm at most at the current stage. However, the surface roughness will be required to be made much smaller as the design rules of electronic device demand severer accuracy requirements in future.

Meanwhile, as the silicon single crystal substrate for use in fabrication of the aforementioned epitaxial wafer, there has been frequently employed a p type substrate which contains boron (B) atoms with a high concentration of the order of $10^{18}/cm^3$ or more. This is because the substrate has a low resistivity of 0.01 to 0.02 $\Omega \cdot cm$, a large mechanical strength and an excellent gettering efficiency. The p type low-resistivity substrate however is inferior to a high-resistivity substrate having a resistivity of 10 $\Omega \cdot cm$ (and having an impurity concentration of the order of $10^{16}/cm^3$ or less), in microscopic smoothness. That is, its mean squared surface roughness Rms is close to 0.2 nm.

In order to improve the microscopic smoothness of such a p type low-resistivity substrate, there has been proposed a method for performing heat treatment on a substrate at a high temperature of 1100° C. or higher in a hydrogen ($H_2$) gas atmosphere. And this method is already put in industrial practical use.

However, this method has a problem that, since boron atoms doped in the silicon single crystal substrate are vaporized and emitted into the atmosphere at such a high temperature, a distribution of the substrate resistivity varies in a depth direction.

The vaporization of boron atoms can be suppressed to a large extent when the thermal treatment temperature is lowered to 1000° C. or lower. Details for it are disclosed in a Journal of the Electrochemical Society vol. 143, p. 677, 1996.

However, in the case where the thermal treatment temperatue to the silicon single crystal substrate is reduced, only when all the temperatures of not only the above $H_2$ gas processing but also all the other processes can be reduced, the boron atom dissipation can be suppressed. A related problem is the temperature of pretreatment for removal of the native oxide film or deposited organic particles.

A method usually employed to remove the native oxide film is to perform thermal treatment on the substrate at a high temperature of 1100° C. or so in an atmosphere of an $H_2$ gas or $HCl/H_2$ mixture gas. Known as other methods for removing the native oxide film at a room temperature, are a wet etching process using a dilute hydrofluoric acid, a process using a combination of a hydrogen fluoride gas and steam, and an Ar plasma process. These processes however have problems that an oxide film re-grows immediately after the treatment, the surface of the substrate become rough, processing facilities are subject to corrosion, etc. At the current stage, the former high-temperature treatment is considered the best.

Meanwhile, organic substances are floating in the air of a clean room installed in a semiconductor plant. The inventors of the present application have found a new fact from experiments that, when a silicon single crystal substrate is left to stand within such a clean room for, e.g., one day, organic particles floating in the room air deposite on the substrate to form an organic substance film of a thickness corresponding to 0.1 to 0.2 nm of silicon oxide film.

This deposited organic film can also be removed typically by a similar high temperature heat treatment to the above in an atmosphere of an $H_2$ gas or a mixture gas of $H_2$ and HCl. As other methods for removing the organic film at a room temperature, there may be considered an ozone($O_3$) treatment, an ultraviolet (UV) irradiation treatment and a treatment corresponding to a combination thereof. These methods, however, are not preferable because an oxide film eventually re-grows on a substrate.

In all of these prior art pretreatment methods, when the treatment temperature is reduced to 1000° C. or lower, it becomes difficult to sufficiently remove the native oxide film or deposited organic particles.

When a silicon single crystal substrate with a surface film such as a native oxide film treated for smoothing with use of a high-temperature $H_2$ gas, there occurs a problem that micro-holes are formed on the surface of the silicon single crystal substrate, which is explained in a Journal of the Electrochemical Society, vol. 142, p. 3092, 1995. This is because an etching rate of the $H_2$ gas to silicon (Si) is far larger than that of the $H_2$ gas to silicon oxide ($SiO_x$) such as a native oxide film, which results in that the etching of the underlying silicon single crystal substrate advances from iside of pinholes or a part of a native oxide film where its thickness is locally thinner. With it, not only microscopic smoothing but also macroscopic smoothing cannot be realized.

In this way, the prior art methods have difficulties in sufficiently removing the native oxide film and deposited organic particles by way of reducing the treatment temperature to lower than 1000° C. and simultaneously realizing the microscopic smoothing of the surface of the silicon single crystal substrate. This has led to a cause of giving limitations to manufacturing of the epitaxial wafer with use of the p type low-resistivity substrate.

SUMMARY OF THE INVENTION

It is therefore an object of the present invention to provide a method for smoothing a surface of a silicon single crystal substrate, by which, even when a process temperature is reduced, foreign matter on the silicon single crystal substrate can be sufficiently removed and, thereafter microscopic smoothing can be realized with a high accuracy.

The inventors of the present application have studied hard in order to attain the above object, and have found the present invention in their studies that, in view of a surface of a silicon single crystal substrate, when the substrate is heated in an $H_2$ gas at a suitable temperature after a deposit thereon is completely removed to expose silicon atoms, the substrate surface can be smoothed.

That is, in a method for smoothing a surface of a silicon single crystal substrate in accordance with the present invention, a native oxide film present on the silicon single crystal substrate is removed in a mixture gas atmosphere of HF and $H_2$ gases in a first step, and then deposited organic particles present on the surface of the silicon single crystal substrate are removed in a mixture gas atmosphere of HCl and $H_2$ gases in a second step. In this connection, the removal of the native oxide film in the first step is carried out at such a first temperature that water contents adsorbed on or absorbed in the film per se can be retained; whereas, the removal of the deposited organic particles in the second step is carried out in such a second temperature that is higher than the first temperature and that the surface roughness of the silicon single crystal substrate can be maintained. The silicon single crystal substrate with the deposits completely removed therefrom is heated in an $H_2$ gas atmosphere in a third step. The heating in the third step is carried out at a third temperature that is higher than the second temperature.

Preferably the first step is carried out in a temperature range not less than 0° C. and less than 100° C.

In accordance with the present invention, the surface roughness of the silicon single crystal substrate can be made small to attain a very high smoothness. When the present invention is applied, in particular, to smoothing of the p type low-resistivity substrate, an excellent smoothness can be attained to the same extent as in the p type high-resistivity substrate while suppressing vaporization of boron atoms doped therein, and the compatibility of a low resistivity with a good smoothness, which has been contradictory requirements in the prior art, can be realized.

Since the smoothness attained by the present invention is more excellent than that of the mirror surface attained by an ordinary smoothing technique such as the CMP, there can be provided such a silicon single crystal substrate that is highly valid for fabrication of very fine, future electronic device, which will require a thin film with a thickness of the order of several nm, or as a substrate for epitaxial growth.

DESCRIPTION OF THE PREFERRED EMBODIMENTS

Figure 1:
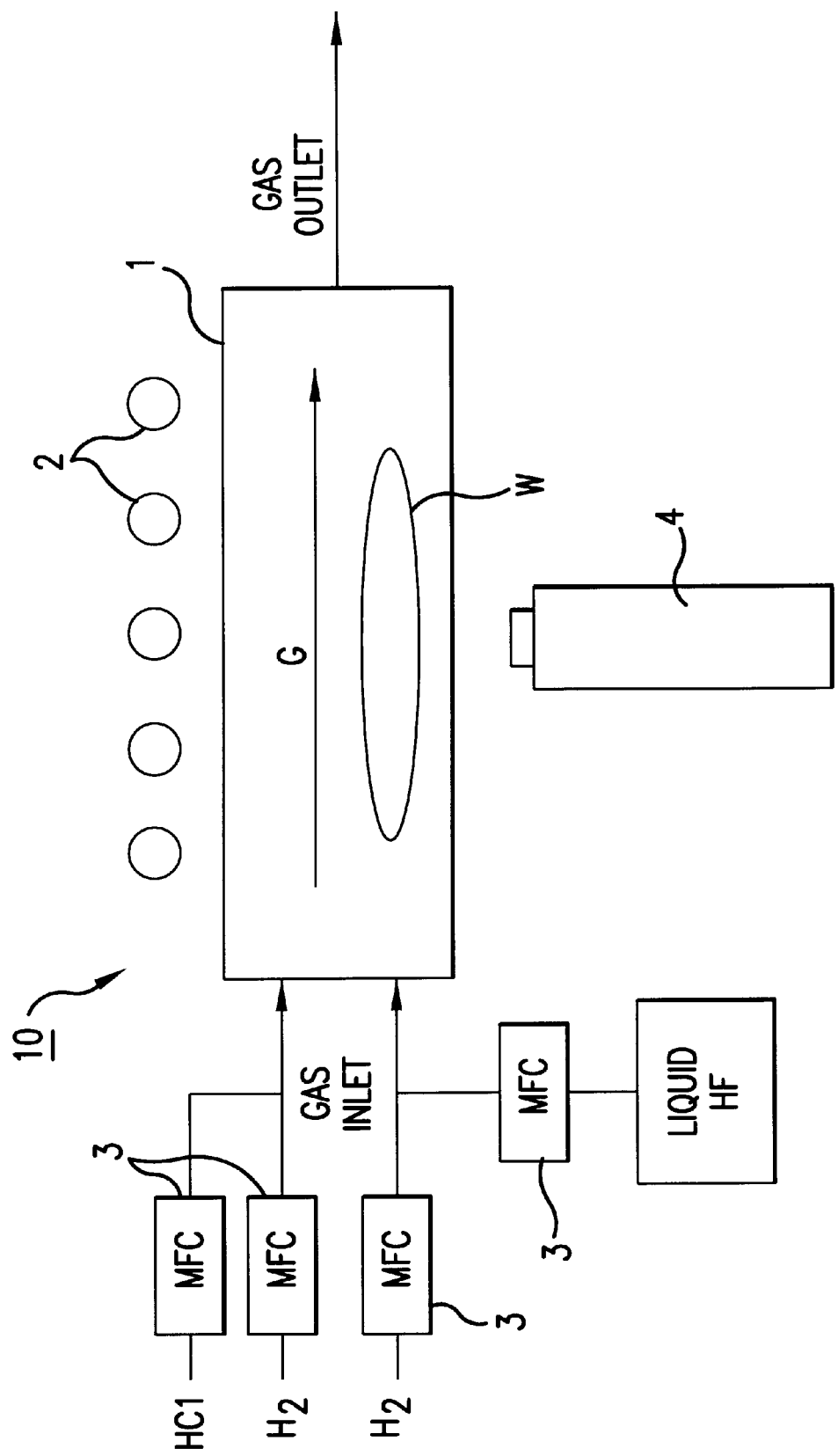
FIG. 1 shows, in a model form, an exemplary arrangement of a vapor phase processing for use in the present invention.

The present inventors have studied hard how to reduce the temperature of a pretreatment process, and found the fact that moisture control in a reaction system is highly important.

In the prior art pretreatment, Ar or $N_2$ is often employed as a carrier gas, the gas always contains a very small amount of water ($H_2O$) or $O_2$, and the water content cannot be perfectly removed due to technical limit. For this reason, an pretreatment atmosphere becomes oxidizing condition and thus it is impossible to perfectly prevent re-growth of an oxide film.

The fine amount of water contained in the carrier gas is a cause of corroding quartz glass (silicon oxide=$SiO_2$) as the material of a processing chamber for the pretreatment using a hydrogen fluoride gas to remove a native oxide film.

An $SiO_2$ etching reaction using an HF gas is expressed by a reaction formula which follows.

$$SiO_2 + 4HF \rightarrow SiF_4 + 2H_2O \tag{1}$$

In actuality, at the very initial stage of this reaction, a small amount of wafer as a catalyst is required. In other words, on a surface not containing any water, the $SiO_2$ etching reaction will not advance. However, once the reaction starts advancing, this reaction produces $H_2O$ and thus autocatalytic reaction thereafter advances the $SiO_2$ etching reaction.

Consider now a water supply source of a catalytic amount of water necessary at the very initial stage of the reaction.

Water is alway present within or on a native oxide film formed on a silicon single crystal substrate, and thus the water adsorbed on or absorbed in the film itself can be used as the catalyst.

Meanwhile, since quartz glass as the material of the processing chamber is used after thermal treatment is repetitively carried out, the glass has substantially no adsorbed water content. In other words, the corrosion of the processing chamber frequently occurred in the prior art process is resulted from the fact that a water content included in the carrier gas acts as a catalyst.

Therefore, in the case of using the HF gas, it will be appreciated that, for the purpose of suitably removing the native oxide film while preventing corrosion of the processing chamber and also suppressing its re-growth, it is only required to thoroughly remove a water contents from the atmosphere gas and alto to leave a water content originally adsorbed or absorbed in the native oxide film.

In view of such considerations, in accordance with the present invention, an $H_2$ gas that can always make the pretreatment atmosphere to be a reduction condition is consistently used as the carrier gas of the pretreatment, and an HF gas that can be available in the market in the form of substantially industrially perfect dry state is used, and the native oxide film is removed in such a temperature (first temperature) that a water content adsorbed on or absorbed in the native oxide film can be kept (a first step). The first temperature is preferably not less than 0° C. and less than 100° C., and is practically room temperature. When a temperature is lower than the temperature range, there may occur such a situation that it becomes impossible to remove the native oxide film or the etching reaction rate drops to reduce its throughput. On the contrary, when a temperature is higher than the temperature range, the water content adsorbed on or absorbed in the native oxide film is evaporated, which results in that the etching reaction will not able to advance.

In this case, the concentration of the HF gas is preferably equal to or higher than 0.5%. When the HF gas concentration is less than 0.5%, the removal rate of the native oxide film remarkably drops. When the HF gas concentration is in a range of 1 to 100%, a time necessary for removal of the native oxide film is nearly the same.

The processing time is preferably between 0.5 and 5 minutes. When the processing time is shorter than 0.5 minutes, the native oxide film cannot be removed sufficiently; while, when the time is longer than 5 minutes, substantially no distinction can be observed in effect, which also forms a cause of undesirably reducing a throughput. The processing time is practically about 3 minutes.

Subsequent removal of the deposited organic particles is carried out with use of an HCl gas (second step). At this time, the temperature (second temperature) is set at such a level that is higher than the above first temperature and that the surface condition of the silicon single crystal substrate can be maintained. In other words, the temperature is set at such a level that the deposited organic particles can be removed, but that the silicon single crystal per se is not etched and that the flatness of the initial surface thereof can be maintained. In the present invention, the temperature is set at a level of preferably not less than 500° C. and less than 800° C. In a temperature range of less than 500° C., the deposited organic particles cannot be effectively removed; while, in a temperature range exceeding 800° C., the surface of the silicon single crystal substrate may be subject to corrosion with fine recesses and projections formed thereon, i.e., with a rough surface. This fine roughness is observed as a haze phenomenon when strong visual light emitted from a halogen lamp is illuminated on the surface of the wafer in a dark room.

The HCl gas concentration is preferably between 0.1 and 10%. In the case of an HCl gas concentration of less than 0.1%, the deposit removal effect is weak, whereas, in the case of an gas concentration of 10% or more, fine roughness takes place on the surface of the silicon single crystal substrate.

The processing time is preferably in a range of one second to 10 minutes. In the case of a processing time shorter than one second, the deposit cannot be fully removed; whereas, in the case of a processing time longer than 10 minutes, substantially no distinction can be observed in the deposite removal effect, which forms a cause of decreasing its throughput.

In the present invention, the order of the first step of removing the native oxide film and the second step of removing the deposited organic particles cannot be reversed. This is because, when the second step is firstly carried out, heating in the second temperature range causes the water content adsorbed on or absorbed in the native oxide film to be evaporated, thus disabling the removal of the native oxide film by the HF gas.

On the surface of the silicon single crystal substrate after the native oxide film and deposited organic particles are substantially completely removed in this manner, the following chemical reactions advance in a high temperature $H_2$ gas atmosphere.

$$Si + 2H_2 \rightarrow SiH_4 \quad (2)$$

$$Si + H_2 \rightarrow SiH_2 \quad (3)$$

These reactions refer to an etching process of silicon atoms. Compounds $SiH_4$ and $SiH_2$ generated through the reactions are evaporated from the surface of the silicon single crystal substrate into the $H_2$ gas atmosphere, or are at least partly discharged to the outside.

Meanwhile, compounds $SiH_4$ and $SiH_2$ are of the same type as silane compound conventionally used as a source gas in the epitaxial growth of the silicon single crystal thin film. Thus in the vapor phase, reactions which follow is advancing simultaneously with the above reactions.

$$SiH_4 \rightarrow Si\downarrow + 2H_2 \quad (4)$$

$$SiH_2 \rightarrow Si\downarrow + H_2 \quad (5)$$

These reactions refer to a deposition process of silicon atoms.

That is, in this system, completely reversed processes of etching the silicon single crystal substrate and depositing silicon atoms will co-exist competitively.

On the rough surface of the silicon single crystal substrate having fine recesses and projections, a substance vapor pressure in the vicinity of projections is microscopically higher than that in the vicinity of recesses. Accordingly, the process of silicon atoms being etched in the form of $SiH_4$ or $SiH_2$ is predominant at the projections, while, the process of silicon atoms being deposited is predominant at the recesses, with the result that the smoothing of the surface of the silicon single crystal substrate is advanced.

A temperature (third temperature) at the time of smoothing the surface of the silicon single crystal substrate is set at a level in a temperature range of preferably not less than 800° C. and less than 1000° C. When the temperature is lower than 800° C., $H_2$ gas does not react with the silicon single crystal substrate and thus smoothing effect cannot be obtained. When the temperature is not less than 1000° C., on the other hand, the smoothing can be achieved but a further improvement in the smoothness beyond a certain level cannot be obtained with a higher temperature. Rather, this involves such disadvantages that the higher temperature causes oxygen precipitate previously present within the silicon single crystal substrate to be solubilized or diffused to thereby reduce the original gettering effect of the substrate, and that impurities contained in the substrate is vaporized to increase its resistivity, and that generation frequency of slip dislocation defects increses.

The present invention is valid for silicon single crystal substrates of any type of conductivity and any impurity concentration, and more valid, in particular, for a p type low-resistivity substrate having a microscopically poor flatness. The p type low-resistivity subsstrate has a high industrial value because of its high mechanical strength, low resistivity and excellent gettering ability. When such a substrate is improved in its surface smoothness, its industrial value will be further enhanced.

Explanation will now be made as to an exemplary a vapor phase apparatus which embodies the method for smoothing the surface of the silicon single crystal substrate in accordance with the present invention, by referring to FIG. 1.

A vapor phase processing apparatus 10 includes a processing chamber 1 in which a wafer W is accommodated. A single wafer W is illustrated in the drawing, but may be provided by more than one.

A gas G introduced from one end of the processing chamber 1 is brought into contact with the wafer W and then discharged from the other end of the processing chamber 1. The gas G flowing within the processing chamber 1 is any one of an $H_2$ gas alone, an HF gas diluted by the $H_2$ gas, and an HCl gas diluted by the $H_2$ gas. Each of these component gases are precisely controlled in their flow rate by a mass flow controller (MFC) 3 respectively and then introduced into the processing chamber 1.

HF is liquid at normal temperatures, but has a large vapor pressure and tends to easily vapor. For this reason, the vaporized component of the HF is mixed with $H_2$ and then sent into the processing chamber 1.

Disposed outside the processing chamber 1 along one main surface of the wafer W are infrared ray lamps 2 which control the heating temperature of the wafer W according to the amount of electrical power to be supplied to the lamps.

Also disposed outside the chamber 1 along the other main surface of the wafer W is a pyrometer 4 which monitors the wafer temperature being processed.

In the present invention, the $H_2$ gas is consistently used as a carrier gas as mentioned above, so that, when a gas supply system of a silicon compound gas and a dopant gas is added to the aforementioned vapor phase processing apparatus 10, the smoothing operation and the epitaxial growth of the silicon single crystal thin film can be continuously carried out in this apparatus. With such an arrangement, the smoothing can be carried out immediately before the epitaxial growth and no need for transporting the wafer W to another place between the smoothing step and epitaxial growth step. Thus re-deposition of organic substance or re-deposition of a native oxide film can be substantially perfectly suppressed. Accordingly, a good quality of epitaxial wafer can be fabricated. A compound gas of $SiCl_4$, $SiHCl_3$, $SiH_2Cl_2$ or $SiH_4$ can be used as the above silicon compound gas; while a $B_2H_6$ or $PH_6$ gas can be used as the dopant gas.

EXAMPLE

A specific example in the embodiments of the present invention will be explained below.

Explanation will be made as to an exemplary process of sequentially performing removal of a native oxide film, removal of deposited organic particles and smoothing the surface on a p type low-resistivity substrate having a high boron concentration, with use of the vapor phase processing apparatus 10 of FIG. 1.

Figure 2:
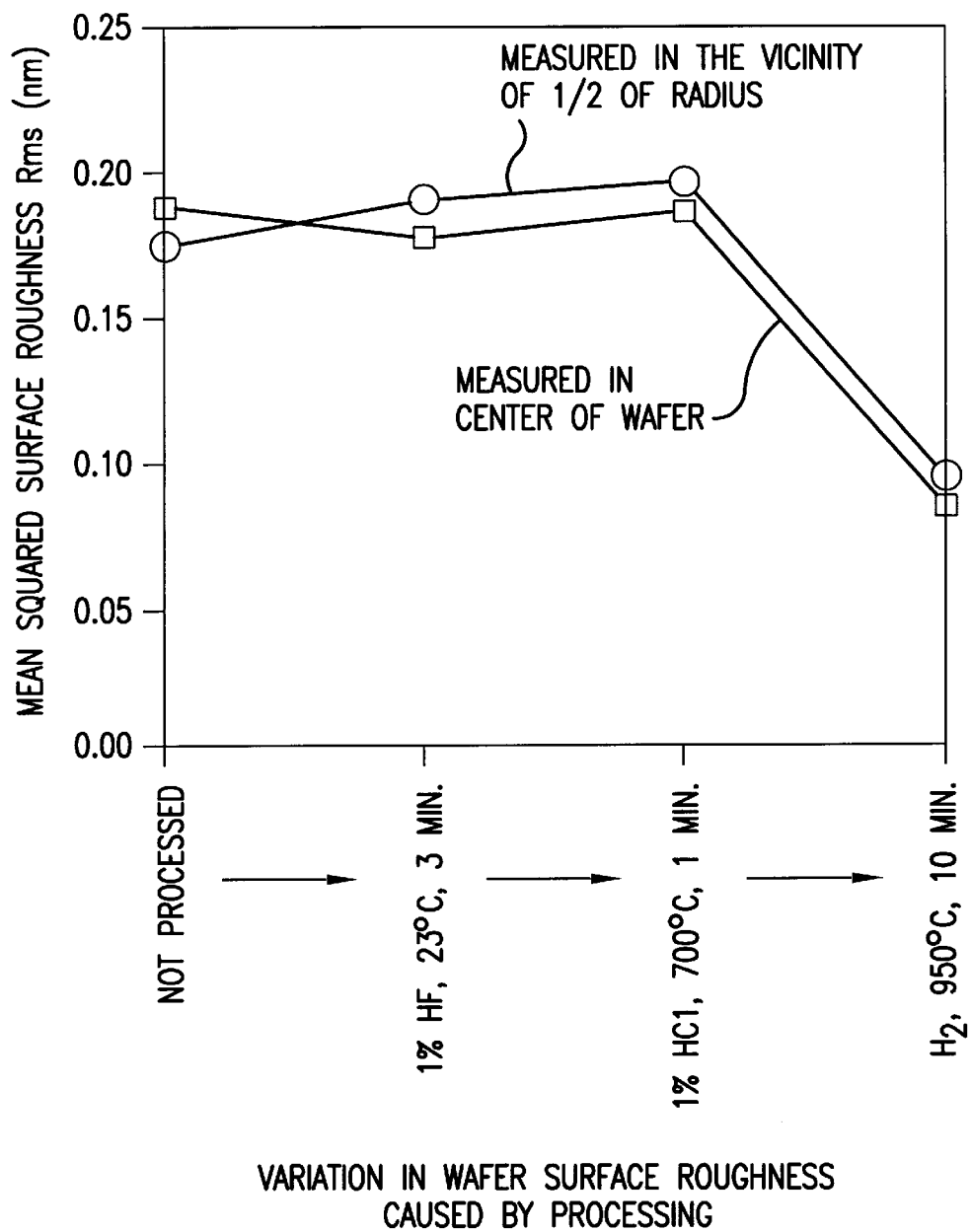
FIG. 2 is a graph showing a variation in surface roughness of a wafer caused by processing of the invention.

FIG. 2 shows a measurement result of the mean squared surface roughness Rms by an atomic force microscope (AFM) conducted in the course of the process.

Figure 3:
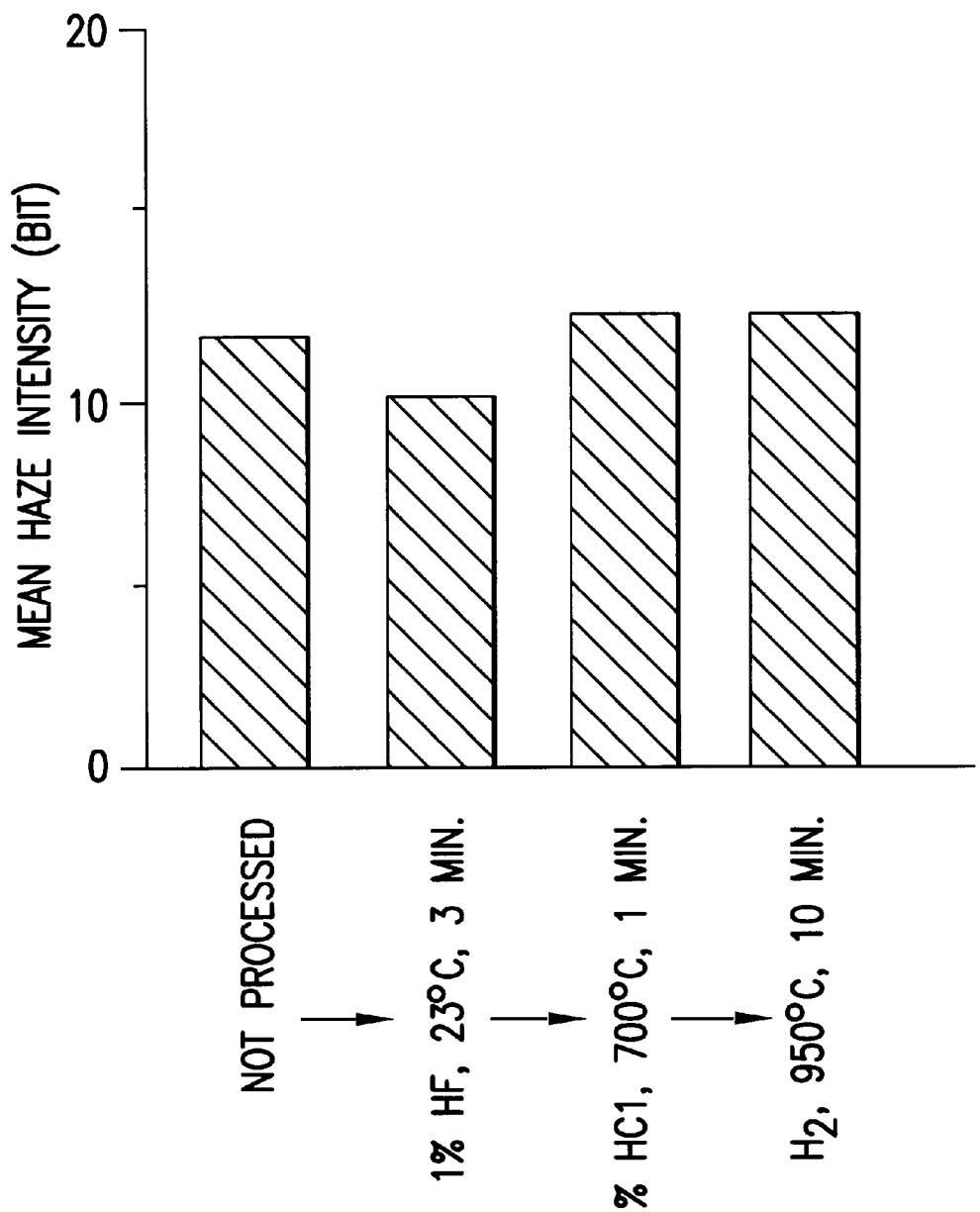
FIG. 3 is a graph showing a variation in mean haze intensity of the wafer caused by the processing of the invention.

FIG. 3 shows a measurement result of mean haze intensity of the entire surface of a wafer using a haze measuring device (type LS-6030 manufactured by Hitachi Electronics Engineering Ltd.) conducted in the course of the process. In the drawing, haze mean value is expressed in relative values.

The wafer W used as a sample is made of a p type low-resistivity silicon single crystal having a main surface with (100) orientation, an off angle of 20'±8', a diameter of 200 mm, a resistivity of 0.02 Ω·cm and a boron (B) concentration of $5 \times 10^{18}/cm^3$. The wafer W has been previously observed by ellipsometry and X-ray photo spectroscopy (XPS) that, as a result of the wafer left to stand for one day in a clean air, a native oxide film having a thickness of 1.1 nm and a deposited organic material thin film having a thickness of 0.2 nm are formed on the wafer W.

Under such a condition that the native oxide film and organic substance thin film deposit on the wafer W, the wafer W was subjected to a measurement of the mean squared surface roughness Rms with respect to a 1 μm-squared zone of the wafer with use of the atomic force microscope (AFM). As its measurement result, as shown by a plot for the "not processed" wafer in FIG. 2, the wafer had a roughness Rms of 0.185 nm in its center and of 0.175 nm in the vicinity of ½ of its radius.

Further, as a result of scanning the wafer throughout its full surface with a photomultiplier tube of the haze measuring device set at a threshold voltage, the "not processed" wafer had a mean haze intensity of 12 bits as shown in FIG. 3.

The wafer W was placed within the processing chamber 1 kept at one atmospheric pressure at 23° C. therein, and a 1% HF mixture gas diluted with an $H_2$ gas was supplied into the chamber at a flow rate of 100 liters per minute for 3 minutes (first step). It has been confirmed by the XPS that, in 0.5 minutes after the start of the gas supply, the native oxide film was almost removed and, in 3 minutes after the start, the film removal was reliably completed.

At this stage, the mean squared surface roughness Rms of the wafer W was measured. As a result, as shown by the plot for "1% HF, 23° C., 3 minutes" in FIG. 2, the wafer had a roughness Rms of 0.185 nm in its center and 0.19 nm in the vicinity of ½ of radius.

Further, the wafer had a mean haze intensity of 10 bits, as shown for "1% HF, 23° C., 1 minute" in FIG. 3.

During the above operation, the wall part of the processing chamber 1 made of quartz glass was not subject to any corrosion. This is because water contents were substantially completely removed from the fed $H_2$ gas and HF gas so that such an $SiO_2$ etching reaction as shown by the aforementioned reaction formula was not advanced.

Next, the supply of the HF gas was stopped and only the $H_2$ gas was continuously supplied. Under this condition, the infrared ray lamps 2 were energized to heat up the wafer W to 700° C. When the temperature was stabilized, a 1% HCl mixture gas diluted with the $H_2$ gas was supplied from one end of the processing chamber 1 at a flow rate of 100 liters per minute for one minute (second step). In this connection, the temperature of the wafer W was monitored with use of the pyrometer 4. In a separately conducted experiment, the wafer W was unloaded from the vapor phase processing vessel 10 and observed with respect to its surface by the XPS at this stage. As a result of the observation, carbon or oxygen resulting from the organic substance was not detected and any signal other than silicon atoms was also not detected. Accordingly, even at this stage in the present example, there was realized a wafer W which has completely no deposit thereon.

At this stage, the wafer W was measured with respect to its mean squared surface roughness Rms. The wafer had a roughness Rms of 0.19 nm in its center and 0.20 nm in the vicinity of ½ of radius. That is, it has been found that, before the pretreatment completion, the wafer has a surface roughness substantially not changed.

Further, the wafer had a mean haze intensity of 13 bits, as shown for "1% HCl, 700° C., 1 minute" in FIG. 3.

Subsequently, the supply of the HCl gas was stopped and only the $H_2$ gas was continuously supplied. Under this condition, the amount of energization to be supplied to the infrared ray lamps was adjusted to heat up the temperature of the wafer W to 950° C. After the temperature was stabilized, the wafer was kept for 10 minutes (third step). The temperature of the wafer W was monitored using the pyrometer 4. Thereafter, the energization of the infrared ray lamps 2 was cut off to lower the temperature of the wafer W to room temperature, after which the wafer was removed from the processing chamber 1.

At this stage, the wafer W was subjected to measurement of its mean squared surface roughness Rms. The wafer had a surface roughness of 0.08 nm in its center and 0.09 nm in the vicinity of ½ of its radius. This means that the surface roughness of the wafer W in the present invention was reduced to nearly half of the surface roughness of the mirror surface attained by the CMP in an ordinary wafer fabricating process.

The above surface roughness is equivalent to that of a p tpe high-resistivity substrate having a resistivity of 10 Ω·cm or so. In other words, according to the present invention, the compatibility of a low resistivity with low surface roughness, which has been so far impossible in the prior art, was able to be attained.

The heating time in the $H_2$ atmosphere in the third step was examined in another experiment, and found that, one minute after starting the heating, the mean squared surface roughness Rms detectable by the AFM starts to vary and 10 to 60 minutes later, the value Rms gradually drops. Thereafter, the value Rms became small in its change rate and, even when the heating was effected for 120 minutes or more, substantially no variation in the value Rms was observed.

Meanwhile, its mean haze intensity was 13 bits, as shown for "$H_2$, 950° C., 10 minutes" in FIG. 3. This means that mean haze intensity in the present example did not vary largely through the entire process.

The aforementioned results of the mean haze intensity seem, on first glance, not to coincide with the fact that the mean squared surface roughness Rms at the end of the process was reduced to half of the surface roughness when the wafer is not processed. However, this is because the measuring units of roughness detectable by the both of AFM and haze methods are essentially different therebetween, which comes from their measuring principles. That is, in the AFM method, since information on surface roughness directly detected by a probe contact is converted to an electrical signal, microscopic surface roughness can be detected on the order of nm or less with respect to a very small area on the wafer. In the haze method based on irregular reflection of visual light (having a wavelength $\lambda$ of 488 nm in the above example), on the other hand, roughness finer than the wavelength of the illuminating light cannot be detected but macroscopic surface step differences through the entire wafer can be detected.

Therefore, it has been found by employing these methods as combined, the microscopic surface roughness problem can be eliminated while having no influences on the macroscopic surface step differences on the wafer in the present example.

Although specific embodiments of the present invention have been explained in connection with the example, the present invention is not limited to the specific example. For example, the foregoing example has been explained in connection with the case where the silicon single crystal substrate is of a p type low-resistivity type, but it will be clear from the viewpoint of the principle that any conduction type of silicon single crystal substrates having any resistivities can exhibit their roughness reducing effects. Further, details of the type of the sample wafer, pretreatment conditions, epitaxial growth conditions and vapor phase growth apparatus arrangement to be employed may be suitably modified, selected or combined as necessary.

What is claimed is:

1. A method for smoothing a surface of a silicon single crystal substrate, comprising:

a first step of removing a native oxide film present on the surface of the silicon single crystal substrate in a mixture gas atmosphere of a hydrogen fluoride gas and a hydrogen gas at such a first temperature that a water content adsorbed on or absorbed in the native oxide film can be retained;

a second step of removing an organic substance deposited on the surface of the silicon single crystal substrate in a mixture gas atmosphere of a hydrogen chloride gas and the hydrogen gas at such a second temperature that is higher than said first temperature and that a surface roughness of the silicon single crystal substrate can be maintained; and a third step of heating said silicon single crystal substrate in a hydrogen gas atmosphere at such a third temperature that is higher than said second temperature.

2. A method for smoothing a surface of a silicon single crystal substrate as set forth in claim 1, wherein said first temperature is set to be not less than 0° C. and less than 100° C., said second temperature is to be not less than 500° C. and less than 800° C., and said third temperature is to be not less than 800° C. and less than 1000° C.

3. A method for smoothing a surface of a silicon single crystal substrate as set forth in claim 1, wherein said silicon single crystal substrate is p type low-resistivity type having an impurity concentration of the order of $10^{18}/cm^3$ or more.

* * * * *